(12) United States Patent
Hiramoto et al.

(10) Patent No.: US 6,370,765 B1
(45) Date of Patent: *Apr. 16, 2002

(54) COMPONENT MOUNTING APPARATUS WITH TRAY PARTS FEEDER

(75) Inventors: Koji Hiramoto, Yamanashi; Kazuo Kido; Hideki Uchida, both of Kofu, all of (JP)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/391,835

(22) Filed: Sep. 8, 1999

(51) Int. Cl.[7] .............................. B23P 19/00; B65G 1/06
(52) U.S. Cl. ...................... 29/740; 29/742; 414/331.14; 414/416.01; 414/416.03
(58) Field of Search .......................... 29/740, 741, 742, 29/743, 759, 799, 739; 414/331.14, 331.18, 404, 416, 413, 422, 416.01, 416.03, 416.05

(56) References Cited

U.S. PATENT DOCUMENTS

| | | | | | |
|---|---|---|---|---|---|
| 5,153,983 A | * | 10/1992 | Oyama | ........................ | 29/740 |
| 5,295,294 A | * | 3/1994 | Ito | ........................ | 29/740 |
| 5,446,960 A | * | 9/1995 | Isaacs et al. | .................. | 29/834 |
| 5,727,311 A | * | 3/1998 | Ida et al. | ...................... | 29/832 |
| 5,807,066 A | * | 9/1998 | Smith | ........................ | 414/802 |
| 5,839,187 A | * | 11/1998 | Sato et al. | .................... | 29/743 |
| 5,937,513 A | * | 8/1999 | Inutsuka et al. | .............. | 29/740 |

FOREIGN PATENT DOCUMENTS

JP 6-252594 * 9/1994 .................. 29/739

* cited by examiner

Primary Examiner—Peter Vo
Assistant Examiner—A. Dexter Tugbang
(74) Attorney, Agent, or Firm—Jordan and Hamburg LLP (57) ABSTRACT

Parts P are fed from a tray parts feeder 1 in which trays 3 loaded with parts P in rows thereon are accommodated. Mount head 18 mounts the parts P onto a substrate 5 that is carried in along guide rails 6 of a substrate transfer section 4. A tray 3 is drawn out from the tray parts feeder 1 by a given pitch and positioned at a predetermined location. The apparatus has a construction such that the tray 3, as it is pulled out, passes under guide rails 6 of the substrate transfer section 4.

15 Claims, 9 Drawing Sheets

Prior Art

Fig. 8B   Fig. 8A

Prior Art

Fig. 9B    Fig. 9A

COMPONENT MOUNTING APPARATUS WITH TRAY PARTS FEEDER

BACKGROUND OF THE INVENTION

1. Technical Field of the Invention

The present invention relates to a component mounting apparatus equipped with a tray parts feeder comprising a plurality of stacked trays each accommodating electronic components in rows.

2. Description of Prior Art

Component mounting apparatus of such kind is designed to be flexible in its function of supplying various types of parts and has come into increasing use in recent years. With the widening demand, it has been accordingly desired to improve its performance, and among other things, to reduce the area for installation of the apparatus and to shorten the tact time of mounting operation. Prior art examples of a component mounting apparatus equipped with a tray parts feeder will be described below with reference to FIGS. 8A, 8B and FIGS. 9A, 9B.

Figures 8A, 8B:
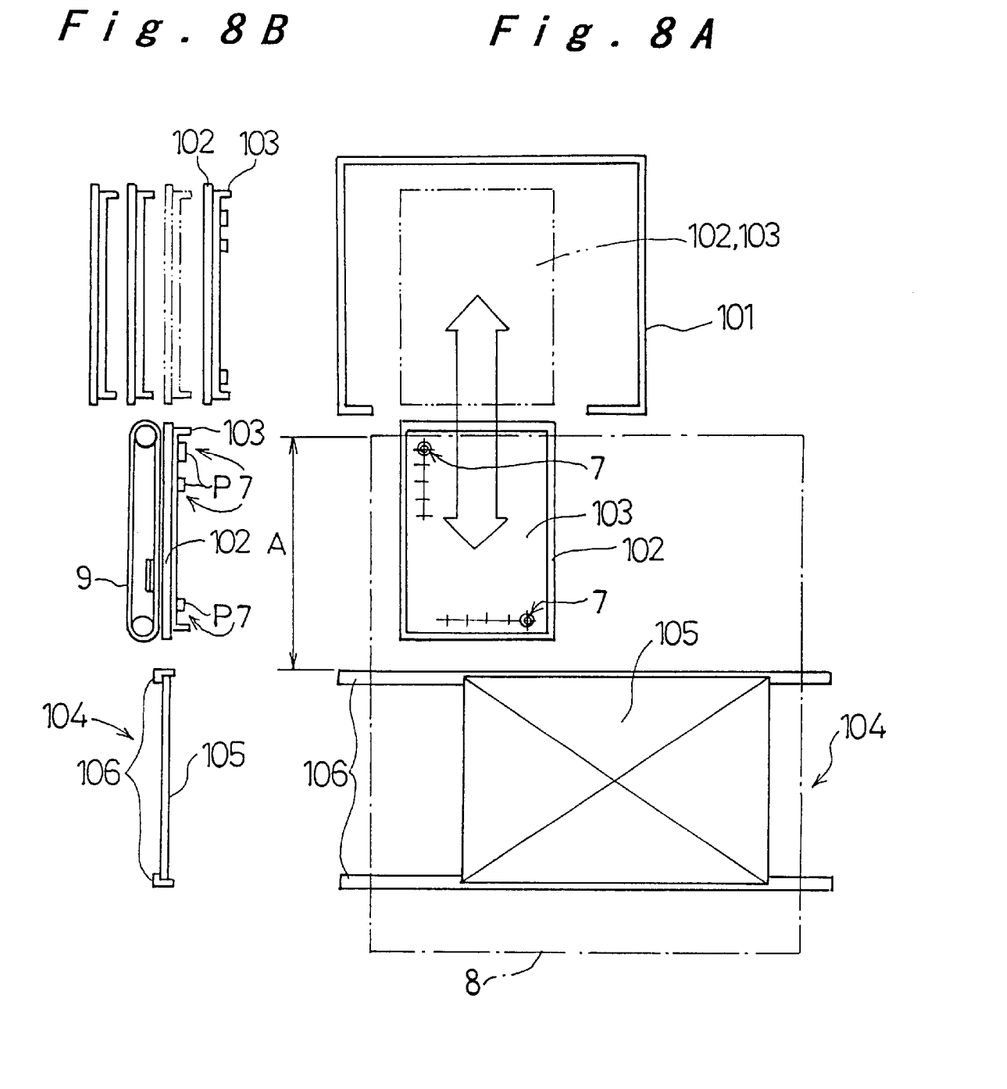
FIG. 8A is a plan view and FIG. 8B is a left side elevation view thereof showing the overall construction of a conventional component mounting apparatus of direct feed type.

FIG. 8A is a block diagram in plan and FIG. 8B is a left side elevation view thereof, showing a component mounting apparatus of so-called "direct feed type" wherein a mounting head takes out parts from a tray and directly mounts them onto a substrate.

In FIGS. 8A, 8B, reference numeral 101 denotes the tray parts feeder, which stocks trays 103 placed on respective tray plates 102. A substrate transfer section denoted 104 is provided for transferring a substrate 105 along guide rails 106. Reference numeral 7 shows some of parts pick-up positions, which can be anywhere on the tray 103, where a mount head (not shown) takes out parts P from tray 103. The movable range of mount head covers the entire area including tray 103 and substrate 105 as indicated in dot-dash lines denoted 8. A tray draw-out driver 9 having a location function using a pulse motor or the like and a position detector is provided for pulling out tray plate 102 from tray parts feeder 101 and locating it at any given position. The surfaces of tray 103 drawn out from tray parts feeder 101 and substrate 105 are positioned at the same elevation so that mount head needs to move only a small distance in upward and downward directions.

The above described component mounting apparatus operates as described below.

Substrate 105 is loaded in along guide rails 106 and located at a predetermined position in substrate transfer section 104. Meanwhile, tray draw-out driver 9 pulls out a tray 103 which is placed at a predetermined position on tray plate 102 from tray parts feeder 101. Mount head takes out parts P aligned in rows on tray 103 and mounts them on substrate 105.

As shown in FIG. 8A, in order to take out all of the parts P on tray 103, there is given a space between tray parts feeder 101 and substrate transfer section 104 by the length A of a longer side of tray 103, and the mount head operates within the range indicated in dot-dash lines 8 covering the area including both of the tray 103 and substrate 105.

In such component mounting apparatus of direct feed type shown in FIGS. 8A, 8B, the moving range 8 of mount head needs to be wide enough to include the area extending the length A. Since the mount head needs to move with a wide stroke, it takes time to pick up parts P from tray 3 and mounts them on substrate 5. Thus the tact time cannot be shortened, and moreover, the apparatus needs a large space for installation.

Figures 9A, 9B:
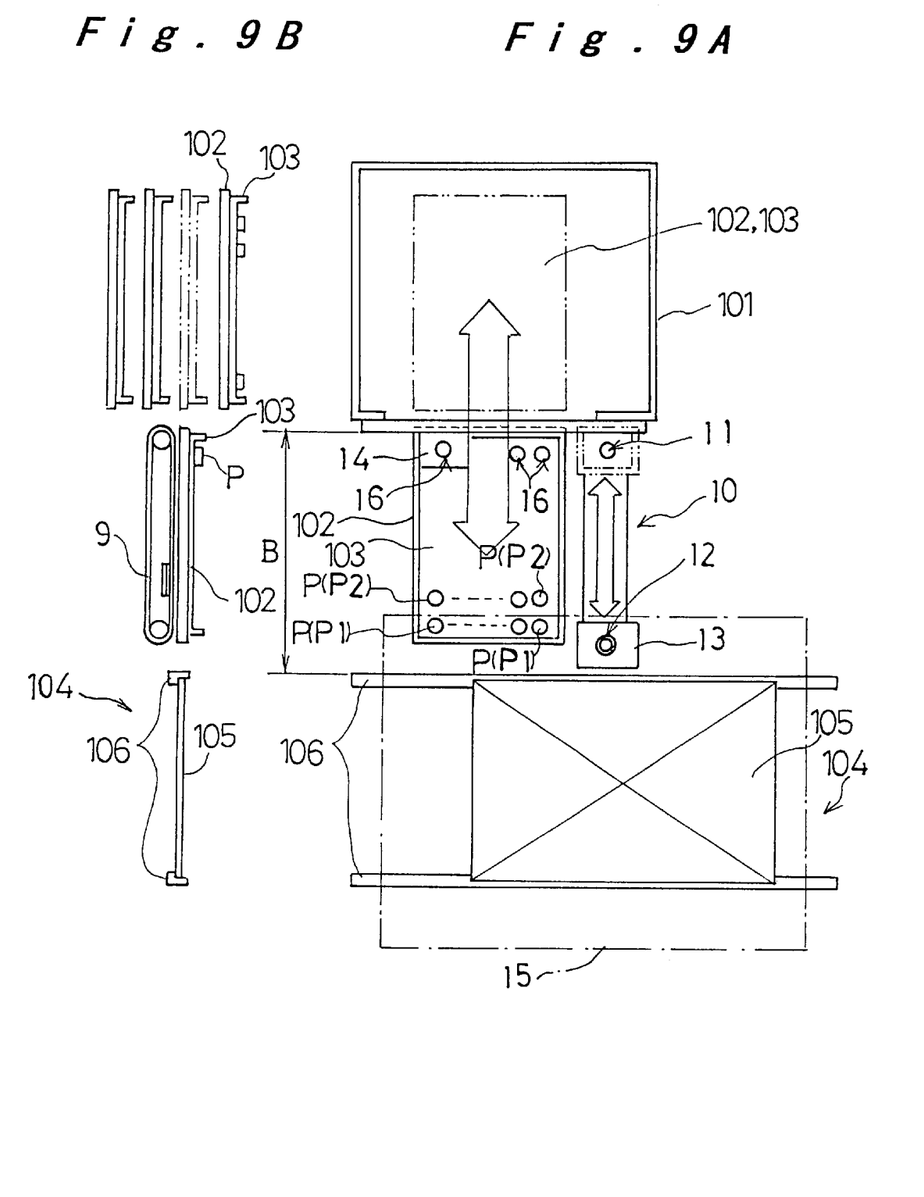
FIG. 9A is a plan view and FIG. 9B is a left side elevation view thereof showing the overall construction of a conventional component mounting apparatus which uses a shuttle.

FIG. 9A is a block diagram in plan and FIG. 9B is a left side elevation view thereof, showing another conventional component mounting apparatus of the type using a shuttle, in which parts are taken out and placed on the shuttle with a transfer unit, and the mount head picks up the parts from the shuttle and mounts them on the substrate.

In FIGS. 9A, 9B, same reference numerals are used to indicate the elements identical to those shown in FIGS. 8A, 8B.

A component transfer device 10 comprises a shuttle 13 for transporting parts P from a position denoted 11 in the vicinity of the tray parts feeder 101 to a pick-up position denoted 12 where the mount head (not shown) picks up parts, and a locatable transfer unit 14 provided in the vicinity of tray parts feeder 101 for taking out parts P from tray 103 and placing them onto shuttle 13 when it is located at position 11. The movable range of mount head is indicated in dot-dash lines denoted 15 and covers the area including the pick-up position 12 of shuttle 13 and the substrate 105. Reference numeral 16 denotes the position of a suction nozzle of the transfer unit 14 where it takes out parts P from tray 103.

Tray 103 is pulled out from tray parts feeder 1 by means of tray draw-out driver 9 and located such that the parts P1 in the first row on tray 103 are positioned just below the suction nozzle position 16 of transfer unit 14. Transfer unit 14 moves in a transverse direction in the figure for taking out parts P1 and placing them onto shuttle 13 which is located at position 11. Shuttle 13 loaded with parts P1 moves to the pick-up position 12 of mount head. When all the parts P1 in the first row on tray 103 have been fed, tray draw-out driver 9 pulls out tray 103 further so that parts P2 in the second row on tray 103 are located below the suction nozzle position 16. Parts are taken out similarly to the parts P1 in the first row. All the parts are thus taken out successively and mounted on substrate 105.

The surfaces of tray 103 drawn out from tray parts feeder 101 and substrate 105 are positioned at the same elevation so that mount head and transfer unit 14 need to move only a small distance in upward and downward directions.

In the component mounting apparatus shown in FIGS. 9A, 9B, although the moving range 15 of mount head is considerably smaller than that 8 of the apparatus shown in FIG. 8A, tray parts feeder 101 and substrate transfer section 104 are distanced from each other by the length B corresponding to the length of a longer side of tray 103 so as to allow all of the parts P to be taken out from tray 103.

The moving stroke of the shuttle 13 extends the length B which is the distance between tray parts feeder 101 and substrate transfer section 104, and it takes time to transport the parts P. Thus the tact time cannot be shortened further and also, the apparatus needs a large space for installation.

SUMMARY OF THE INVENTION

The present invention solves these problems by providing a component mounting apparatus in which the space for locating the tray plate and the movable range of the mount head are remarkably reduced so that the tact time of picking up and mounting parts P is shortened and the space for installing the apparatus is diminished.

To accomplish the above object, a component mounting apparatus of the present invention generally comprises a tray parts feeder accommodating stacked trays on which components are stocked in rows, a substrate transfer section having guide rails for transferring a substrate, a mount head for mounting components onto a substrate; and a tray draw-out driver capable of pulling out a tray from the tray parts feeder at any given pitch and positioning same at a predetermined location, wherein a part of the tray drawn out from the tray parts feeder passes under the guide rails of the substrate transfer section.

According to the present invention, pick-up positions of the mount head where it takes out components from tray can be set close to the guide rails for the substrate, since the tray, as it is drawn out by a predetermined pitch, passes under these guide rails. In other words, the moving stroke of the mount head is reduced, and the tact time for taking out components and mounting them onto substrate is accordingly shortened. Moreover, since the space between the tray parts feeder and guide rails for substrate transfer is made smaller, the overall size of the apparatus is reduced and the area for installation thereof is diminished.

It is more preferable if the above apparatus further includes a component transfer device for taking out the components accommodated in rows on the tray and for transporting them to a predetermined pick-up position of the mount head in the vicinity of the substrate, since such transfer device enables the mount head to perform component mounting from the pick-up position onto a substrate and not from the tray, thereby the moving stroke of mount head is further reduced and the tact time is further shortened.

It is more preferable if the above component transfer device includes an elevator provided with a component holder at its distal end, the elevator having a stopper which operates when parts are transferred between the tray and shuttle that are on different elevations, so that the pressure applied to the parts can be maintained same.

If the component transfer device is constructed to be capable of transporting a plurality of components at one time, the time required for transporting components can be further shortened.

The component transfer device should preferably comprise a shuttle for transporting the components to the pick-up position of the mount head and a transfer unit for taking out the components from the tray and transferring them onto the shuttle. With such transfer device, it is possible to transport components to the pick-up position of the mount head during a next set of components are being taken out from the tray.

It is preferable if the trays are accommodated on respective tray plates at a predetermined location thereon, since various sizes of trays can be thereby accommodated in the same apparatus.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF PREFERRED EMBODIMENTS

First Embodiment

First embodiment of a component mounting apparatus of the present invention will be hereinafter described with reference to FIG. 1 and FIG. 2.

Figure 1:
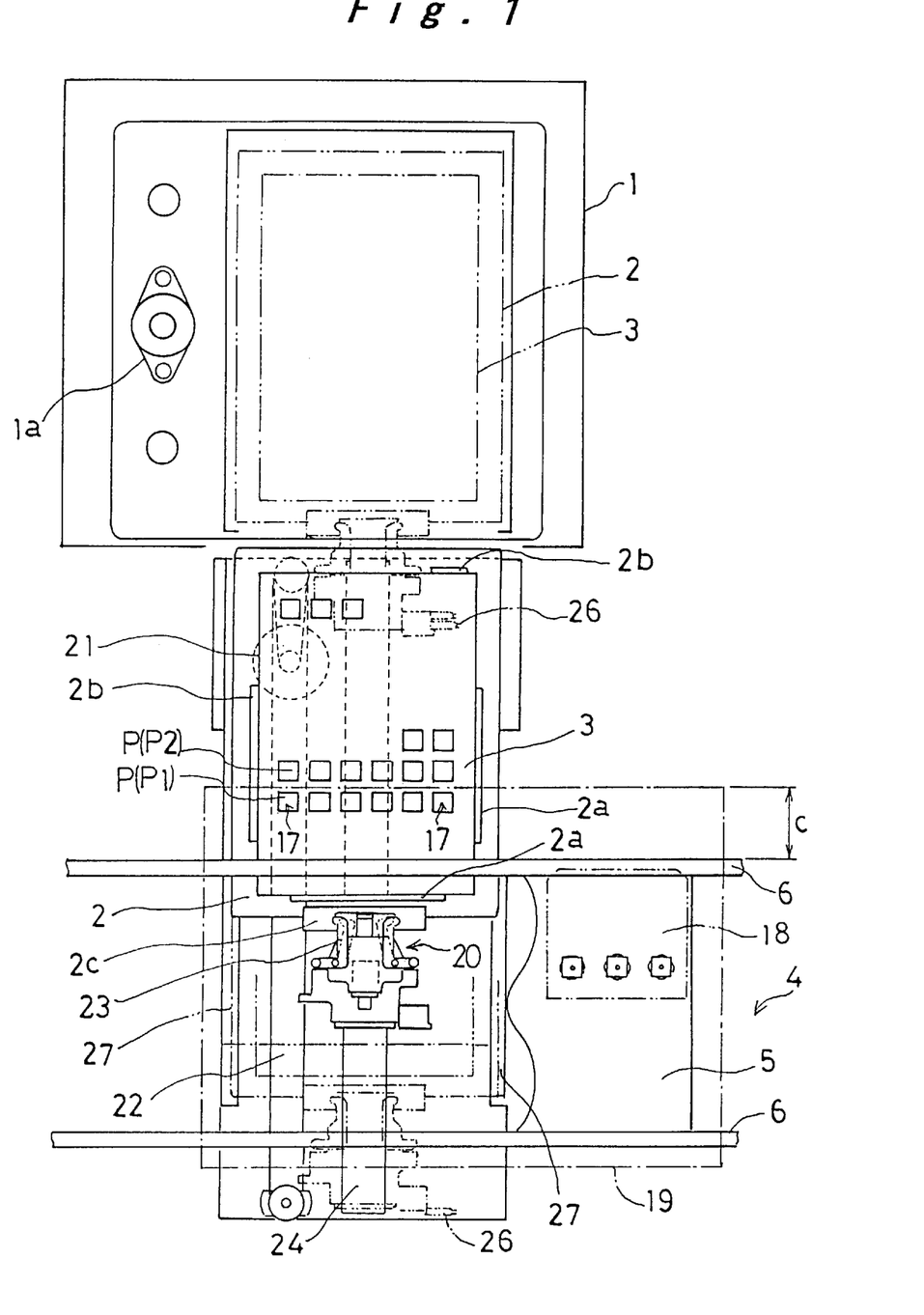
FIG. 1 is a plan view showing the overall construction of the first embodiment of a component mounting apparatus of the present invention.
Figure 2:
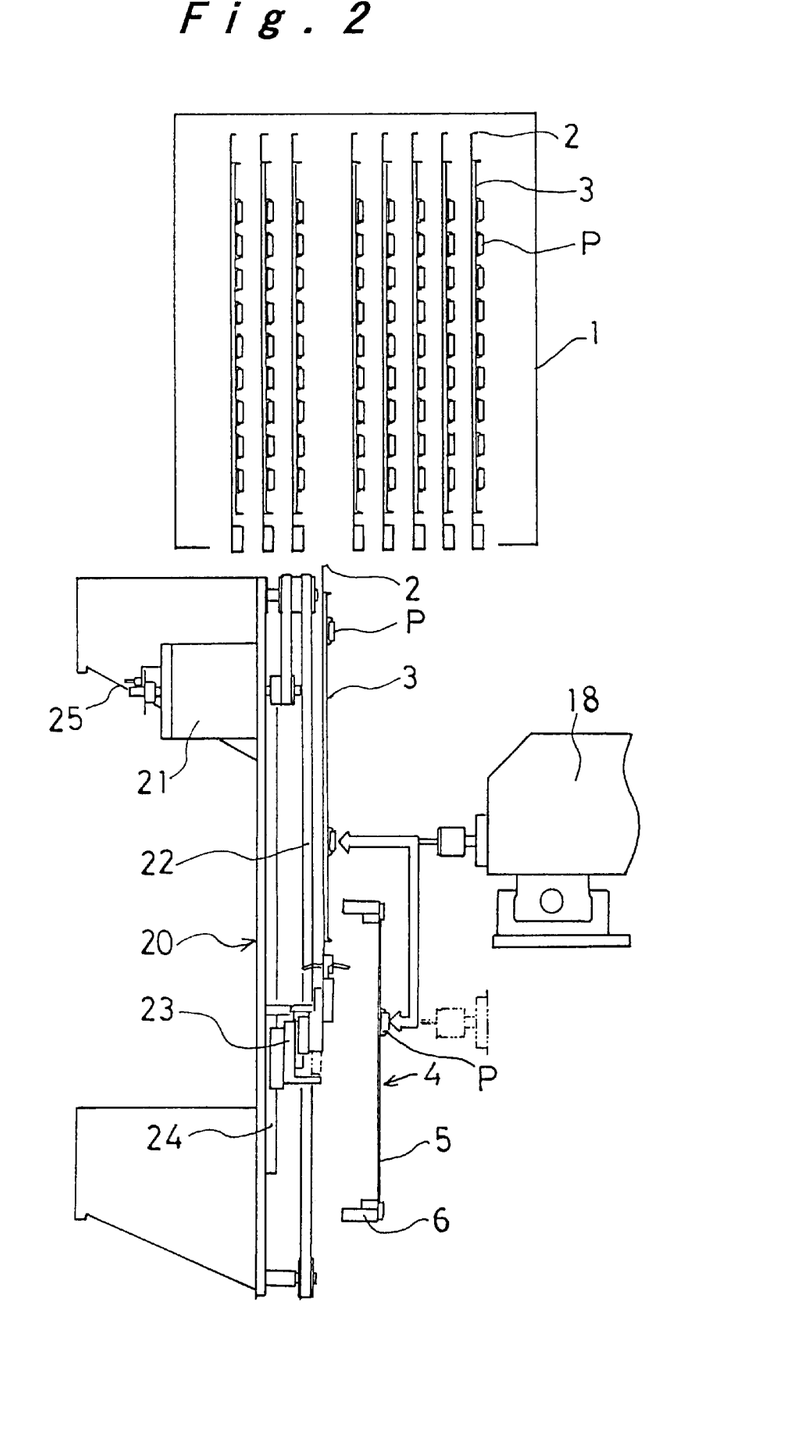
FIG. 2 is a left side elevation view of FIG. 1.

FIG. 1 is a plan view showing the overall construction of the component mounting apparatus with tray parts feeder and FIG. 2 is a left side sectional view of FIG. 1.

Referring to FIG. 1 and FIG. 2, the tray parts feeder 1 is shown in which trays 3 are stacked and accommodated. Each tray 3 is placed at a predetermined position on respective tray plates 2 with location blocks 2a and magnet blocks 2b. Tray parts feeder 1 has an elevation adjuster 1a for moving trays 3 up and down and locating a given one at a tray discharge position.

Substrate transfer section 4 has guide rails 6 for transferring substrate 5. Reference numeral 17 shows the parts pick-up position where the mount head 18 takes out parts P from tray 3.

The movable range of mount head 18 is indicated in dot-dash lines denoted 19 and covers the area including the parts pick-up position 17 and substrate 5.

A tray draw-out driver 20 comprises a pulse motor or servo motor 21 for driving a belt 22, a gripper 23 connected to belt 22, a direct drive guide 24 on which gripper 23 is moved, and a rotational position detector 25 and position detectors 26, 26 in front and back, respectively.

Gripper 23 engages a coupling portion 2c provided on the front face of tray plate 2 within tray parts feeder 1 for pulling out tray plate 2 on guide rails 27 and for positioning same at a given location.

Guide rails 27 are disposed beneath the substrate transfer guide rails 6 of the substrate transfer section 4 so that tray plate 2 and tray 3 pass under the substrate transfer guide rails 6, and also, guide rails 27 are disposed adjacent to substrate 5.

Next, the operation of the first embodiment of the component mounting apparatus will be described.

A substrate 5 is loaded in along substrate transfer guide rails 6 and positioned at a predetermined location in substrate transfer section 4. Meanwhile, gripper 23 of tray draw-out driver 20 engages coupling portion 2c in the front end of tray plate 2 fixedly accommodating tray 3 thereon within tray parts feeder 1, pulls it out, and positions the tray plate 2 such that parts P1 in the first row on tray 3 come to just below the pick-up position 17 of mount head 18. Mount head 18 takes out parts P1 in the first row on tray 3 and mounts them on substrate 5.

When all of the parts P1 in the first row on tray 3 have been fed, tray draw-out driver 20 moves tray plate 2 and tray 3 to a position such that parts P2 in the second row on tray 3 come to just below the pick-up position 17 of mount head 18. Tray 3 is successively moved to a next position similarly until parts P in the last row are fed.

As described above, the tray plate 2 is drawn out such that the empty part of tray 3 where parts P1, P2, and so forth have already been fed passes under the substrate transfer guide rails 6 of substrate transfer section 4, and therefore the mount head 18 does not need to move over the entire area above tray 3 for taking out parts but only within the range extending the length C which corresponds to one row of aligned parts on tray 3. The moving range of mount head 18 for taking out parts is remarkably reduced as compared to the length A in prior art example shown in FIG. 8A.

Second Embodiment

Figure 3:
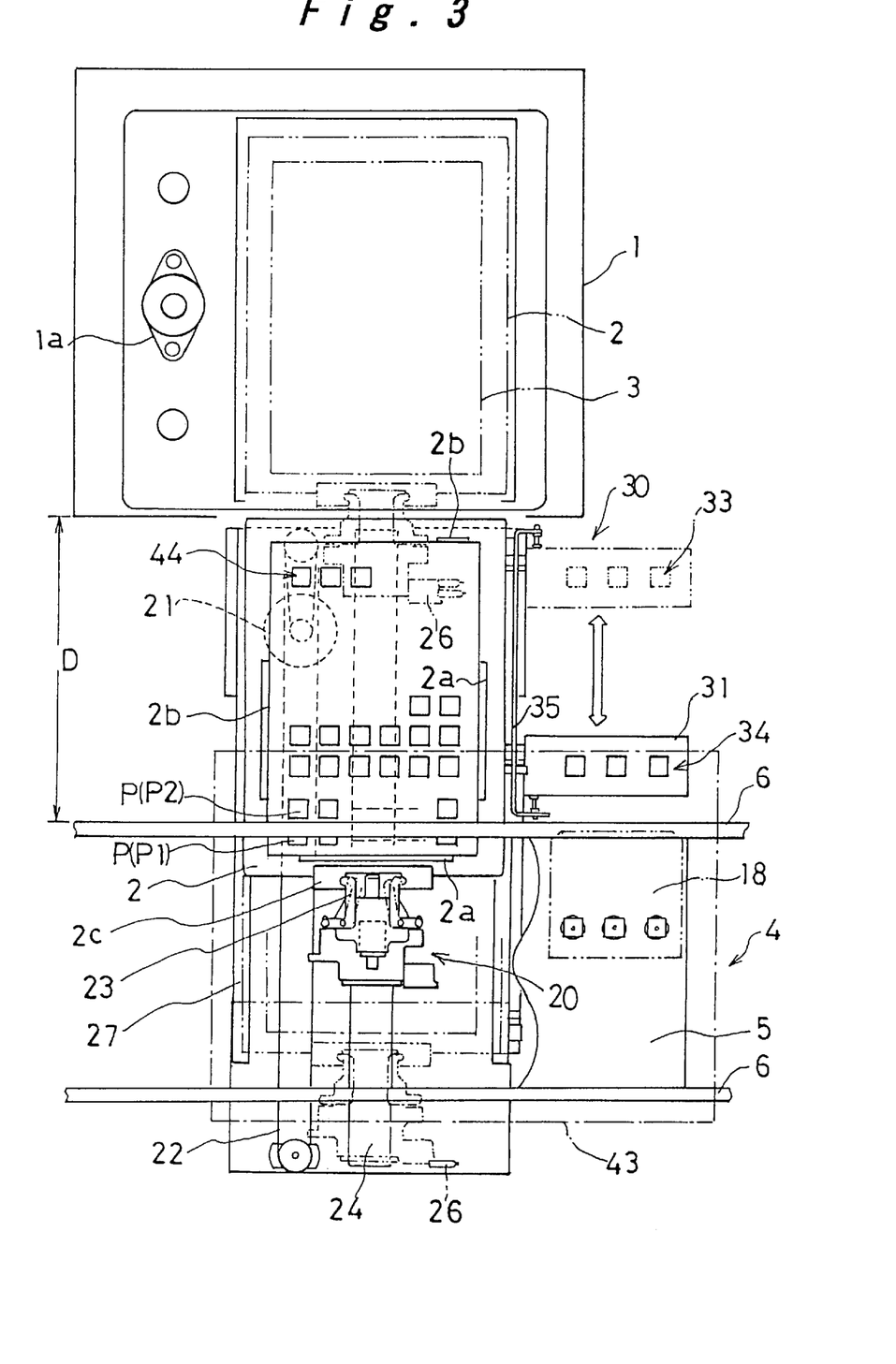
FIG. 3 is a plan view showing the overall construction of the second embodiment of a component mounting apparatus of the present invention.
Figure 4:
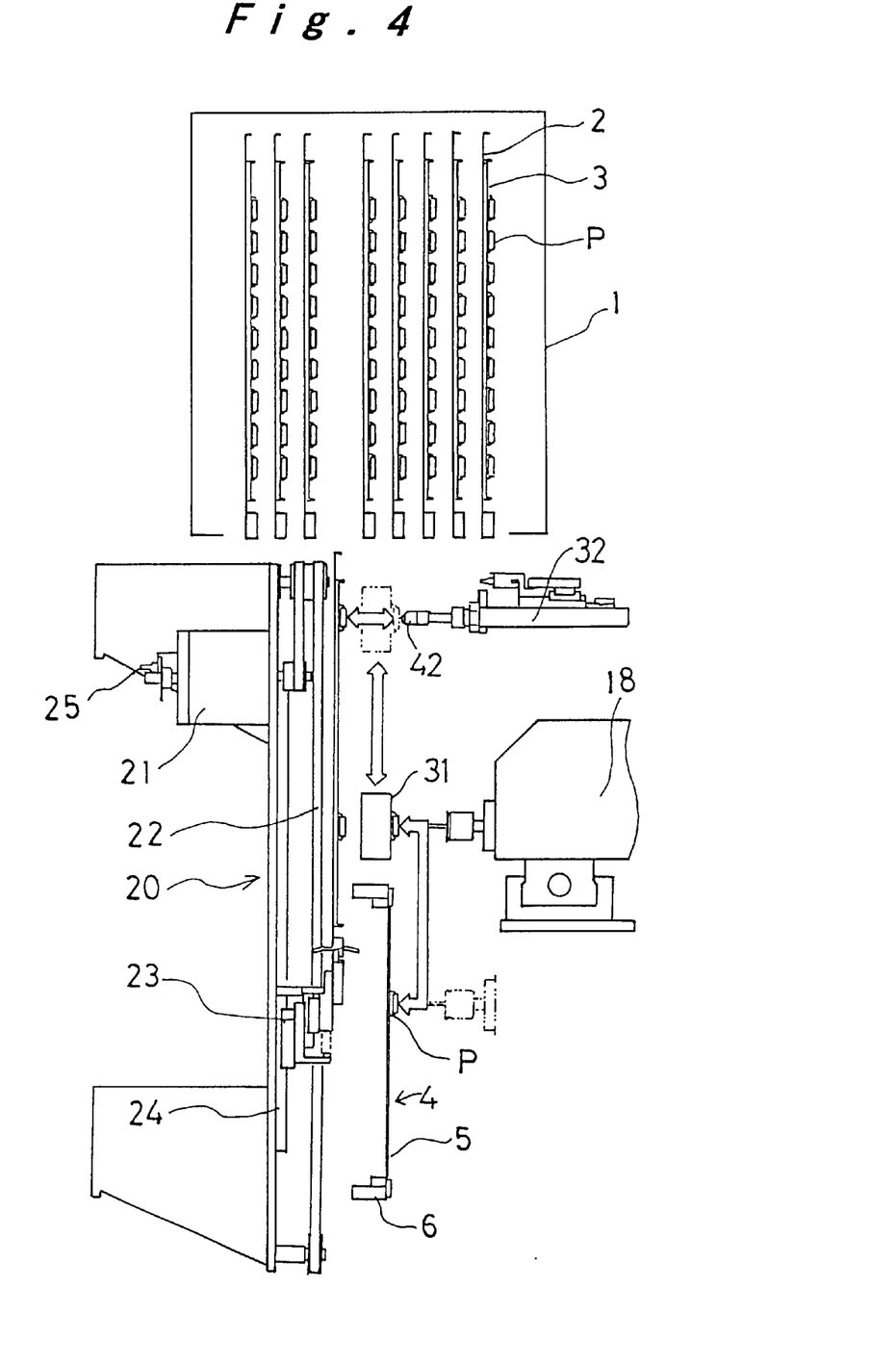
FIG. 4 is a left side elevation view of FIG. 3.
Figure 5:
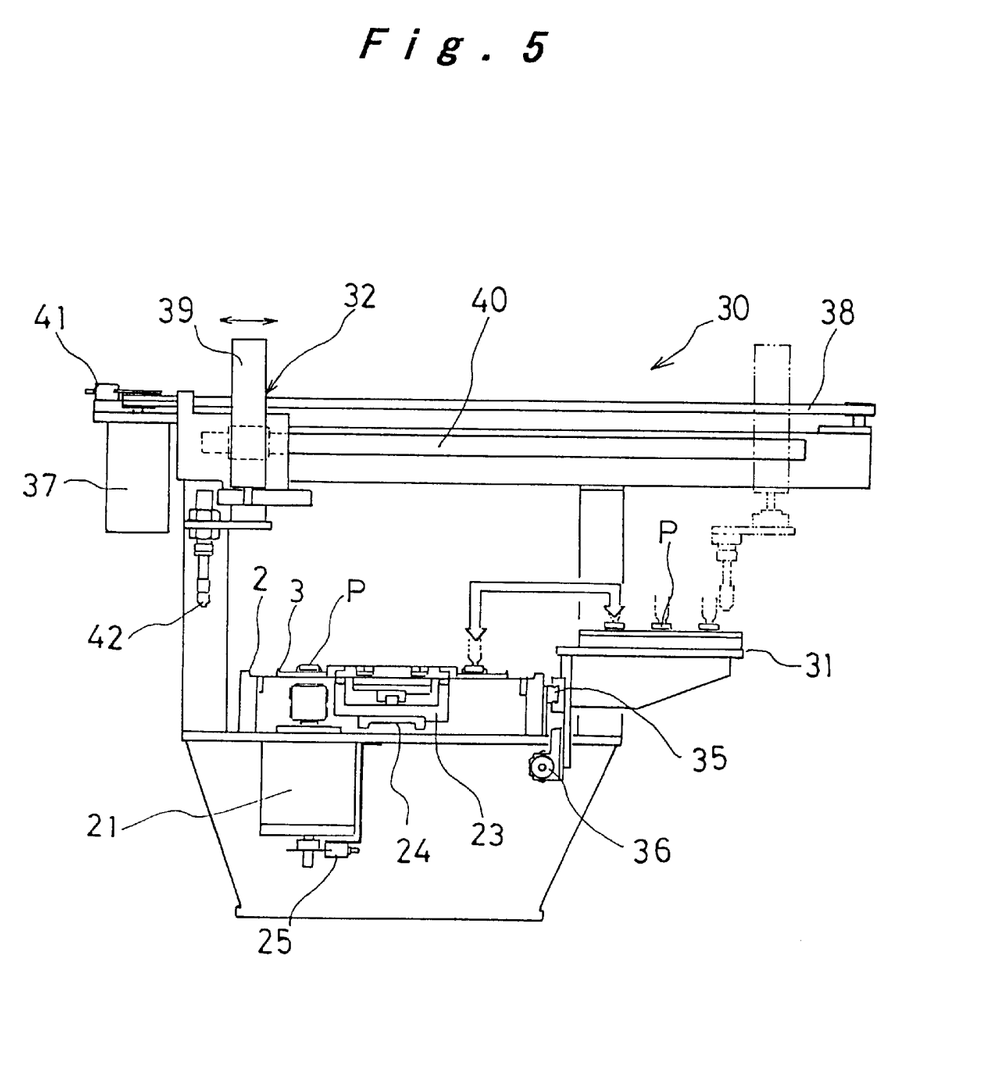
FIG. 5 is a front view of FIG. 3.
Figure 6:
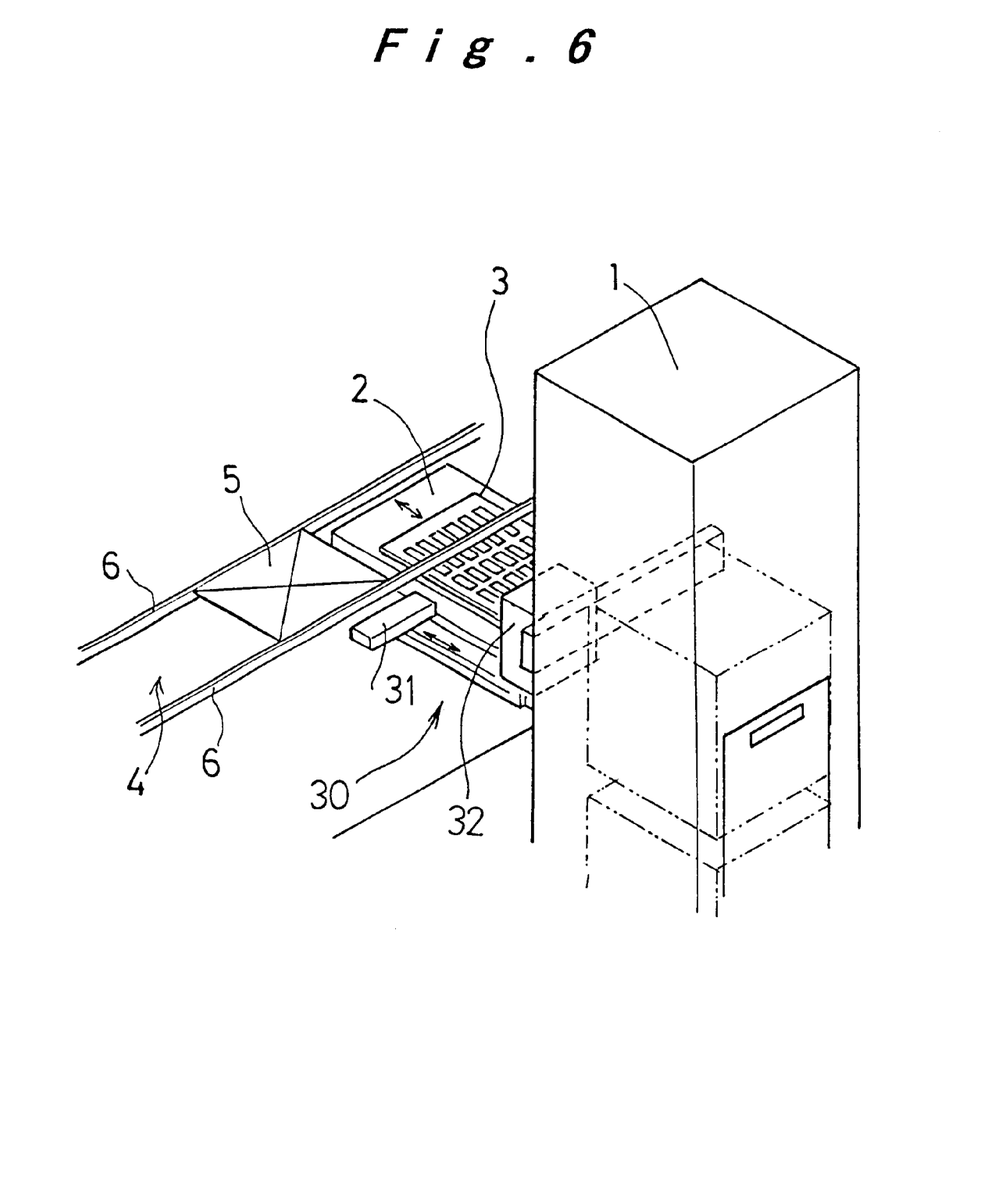
FIG. 6 is a perspective view diagrammatically showing the second embodiment of the component mounting apparatus of the present invention.

FIG. 3 shows in plan the overall construction of the second embodiment of a component mounting apparatus with tray parts feeder, FIG. 4 is a left side elevation view thereof, FIG. 5 is a front view thereof, and FIG. 6 is a perspective view thereof showing only primary parts.

In FIGS. 3–6, tray parts feeder 1, substrate transfer section 4, mount head 18, and tray draw-out driver 20 are the same as those of the first embodiment. Thus only the characteristics of the second embodiment will be described below.

Referring to FIG. 4 and FIG. 5, a parts transfer device 30 comprises a shuttle 31 and a transfer unit 32. Shuttle 31 is driven along a direct drive guide 35 by an actuator 36 for transporting parts P from a nearby position 33 in the vicinity of tray parts feeder 1 to a parts pick-up position 34 of mount head 18.

Transfer unit 32 is provided in the vicinity of tray parts feeder 1 and comprises an elevator 39 connected to a driving belt 38 and moved along a direct drive guide 40, the driving belt 38 being driven by a pulse motor or servo motor 37. A rotational position detector 41 and front and back position detectors (not shown) are provided so that the elevator 39 can be positioned at any given location.

Elevator 39 has a parts holder or preferably a suction unit 42 at its distal end for holding and transporting parts P. While shuttle 31 is situated at the nearby position 33, elevator 39 takes out parts P from tray 3 with its suction unit 42 and places them onto shuttle 31. The movable range of mount head 18 is indicated in dot-dash lines 43 in FIG. 3 and covers the parts pick-up position 34 and substrate 5. Reference numeral 44 denotes the pick-up position of suction unit 42 of transfer unit 32 where it takes out parts P from tray 3.

Next, the operation of the second embodiment of the component mounting apparatus will be described.

Tray draw-out driver 20 pulls out tray plate 2 and tray 3 from tray parts feeder 1 and positions them such that parts P1 in the first row on tray 3 come to just below the pick-up position 44 of the suction unit 42 of transfer unit 32. Transfer unit 32 moves in a transverse direction in FIG. 3, and successively takes out parts P1 in the first row from tray 3 and places them onto shuttle 31 which is located at the nearby position 33 in the vicinity of tray parts feeder 1. Upon receipt of parts P1, shuttle 31 moves to the parts pick-up position 34 of mount head 18.

When all of the parts P1 in the first row on tray 3 have been fed, tray draw-out driver 20 pulls out tray plate 2 and tray 3 further such that parts P2 in the second row on tray 3 come to just below the pick-up position 44 of suction unit 42. Parts P2 are taken out and fed similarly to parts P1 in the first row. All the other parts are similarly fed and mounted on substrate 5.

As the tray 3 is successively pulled out by a given pitch, the empty part of tray 3 and tray plate 2 are advanced such as to pass under the substrate transfer rails 6 of the substrate transfer section 4. As can be seen, the distance D between tray parts feeder 1 and substrate transfer section 4 is shorter than the distance B in the prior art example shown in FIG. 9A. Since the shuttle 31 only needs to travel a short distance, the tact time for transferring parts can be shortened as compared to the prior art example shown in FIG. 9A.

Figure 7A:
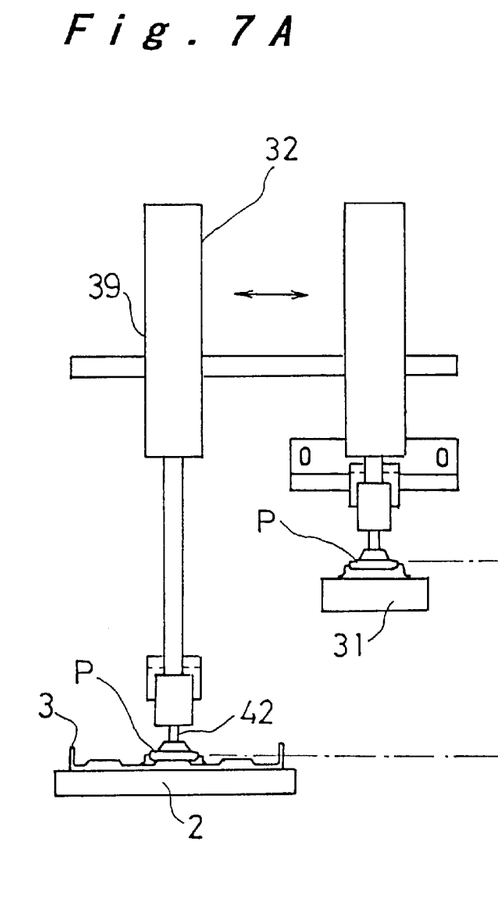
FIG. 7A is a plan view and FIG. 7B is a right side elevation view in cross section thereof showing the details of a component transfer unit in the present invention.
Figure 7B:
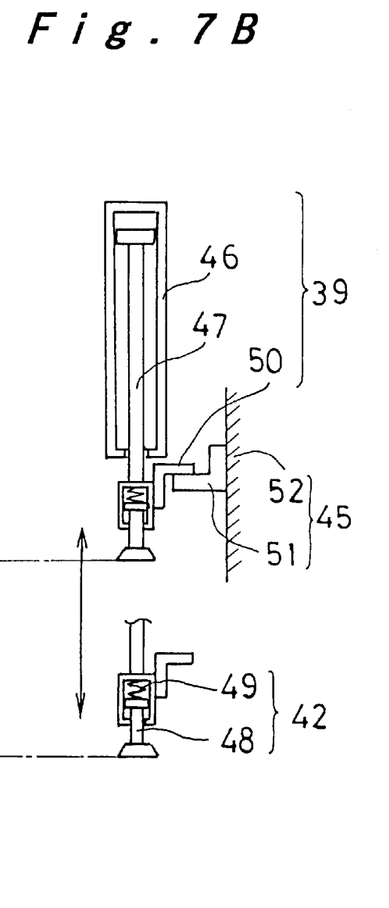

FIG. 7A shows the elevator 39, suction unit 42, and a stopper 45 in the transfer unit 32 of the second embodiment shown in FIG. 5 in detail, and FIG. 7B is a right side elevation view in cross section of FIG. 7A.

In FIG. 7B, a suction nozzle 48 is attached with a rod guide via a spring 49 to the distal end of a cylinder rod 47 encased in a cylinder 46. A stopper bracket 50 is mounted to cylinder rod 47, and a stopper block 51 is provided to a stationary portion in the apparatus such as the tray parts feeder 1 or a frame portion 52 of the transfer unit 32.

When transferring parts P onto shuttle 31, the yielding amount of spring 49 can be adjusted to be the same as the yielding amount thereof when parts P are picked up by suction from tray 3 by varying the height of the stopper block 51. The pressure applied to parts P at different heights is thus maintained appropriately by such mechanism, without providing an additional control device for adjusting pressure using air or the like.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A component mounting apparatus, comprising:

a tray parts feeder accommodating stacked trays on which components are stocked in rows;

a substrate transfer section for transferring a substrate, said substrate transfer section including guide rails on which the substrate is carried and positioned at a predetermined fixed mounting position, said guide rails being laterally spaced apart from said tray parts feeder by a given distance, said selected tray being movable laterally outward of said tray parts feeder in a direction of said guide rails over a distance exceeding said given distance, said guide rails being disposed at a higher position than a selected tray drawn out from the tray parts feeder such that when the selected tray is drawn out from the tray parts feeder farther than said given distance, at least a part of the tray passes directly underneath the guide rails;

a mount head that is movable in X and Y directions for picking up components supplied from the tray parts feeder and for mounting the components onto the substrate at the mounting position on the guide rails; and a tray draw-out driver capable of pulling out a tray from the tray parts feeder and of positioning the tray at a predetermined location.

2. The component mounting apparatus according to claim 1, further comprising a component transfer device for taking out the components accommodated in rows on the tray and for transporting said components to a predetermined pick-up position of the mount head in the vicinity of the substrate.

3. The component mounting apparatus according to claim 1, wherein the trays are accommodated on respective tray plates at a predetermined location thereon.

4. A component mounting apparatus, comprising:

a tray parts feeder accommodating stacked trays on which components are stocked in rows;

a substrate transfer section for transferring a substrate, said substrate transfer section including guide rails on which the substrate is carried and positioned at a predetermined fixed mounting position, said guide rails being laterally spaced apart from said tray parts feeder by a given distance, said selected tray being movable laterally outward of said tray parts feeder in a direction of said guide rails over a distance exceeding said given distance, said guide rails being disposed at a higher position than a selected tray drawn out from the tray parts feeder such that when the selected tray is drawn out from the tray parts feeder farther than said given distance, at least a part of the tray passes directly below the guide rails;

a mount head that is movable in X and Y directions for picking up components supplied from the tray parts feeder and for mounting the components onto the substrate at the mounting position on the guide rails;

a tray draw-out driver capable of pulling out a tray from the tray parts feeder and of positioning the tray at a predetermined location; and a component transfer device for taking out the components accommodated in rows on the tray and for transporting said components to a predetermined pick-up position of the mount head in the vicinity of the substrate, the component transfer device including an elevator provided with a component holder at a distal end thereof, the elevator having a stop for engaging structure of said component transfer device locatable at a selected height for determining the position of the component holder in upward and downward directions.

5. A component mounting apparatus, comprising:

a tray parts feeder accommodating stacked trays on which components are stocked in rows;

a substrate transfer section for transferring a substrate, said substrate transfer section including guide rails on which the substrate is carried and positioned at a predetermined fixed mounting position, said guide rails being laterally spaced apart from said tray parts feeder by a given distance, said selected tray being movable laterally outward of said tray parts feeder in a direction of said guide rails over a distance exceeding said given distance, said guide rails being disposed at a higher position than a selected tray drawn out from the tray parts feeder such that when the selected tray is drawn out from the tray parts feeder farther than said given distance, at least a part of the tray passes directly below the guide rails;

a mount head that is movable in X and Y directions for picking up components supplied from the tray parts feeder and for mounting the components onto the substrate at the mounting position on the guide rails;

a tray draw-out driver capable of pulling out a tray from the tray parts feeder and of positioning the tray at a predetermined location; and a component transfer device for taking out the components accommodated in rows on the tray and for transporting said components to a predetermined pick-up position of the mount head in the vicinity of the substrate, the component transfer device comprising a shuttle for transporting the components to the pick-up position of the mount head and a transfer unit for taking out the components from the tray and transferring them onto the shuttle.

6. The component mounting apparatus according to claim 5, wherein the shuttle is capable of accommodating and transporting a plurality of components at one time.

7. A component mounting apparatus, comprising:

a substrate transfer section operable to transfer a substrate and to position the substrate at a predetermined component mounting position;

a tray parts feeder accommodating stacked trays on which components are arranged, at least one of said substrate transfer section and said tray parts feeder being movable vertically to permit vertical positioning of said substrate transfer section and said tray parts feeder relative to one another such that a selected one of said trays may be oriented in a tray discharge position in which said selected one of said trays is positioned lower than said substrate transfer section, said selected one of said trays being movable laterally outward of the tray parts feeder in a direction of said substrate transfer section between a stacked position and a fully extended position, at least a portion of said selected one of said trays in said tray discharge position passing directly underneath said substrate transfer section when moved to said fully extended position; and a mount head movable in X and Y directions for picking up selected ones of said components supplied from the selected one of said trays of the tray parts feeder when located between said stacked position and said fully extended position and for mounting said components onto the substrate located at the mounting position.

8. The component mounting device according to claim 7, further comprising a tray draw-out driver operable to pull out said selected one of said stacked trays from the tray parts feeder and to position the tray between said stacked position and said fully extended position.

9. The component mounting device according to claim 7, wherein said tray parts feeder includes an elevation adjuster for moving said trays upward and downward relative said substrate transfer section to said tray discharged position.

10. The component mounting device according to claim 7, wherein said substrate transfer section includes guide rails along which said substrate is transferred, at least a portion of said selected one of said trays passing directly below said guide rails when moved to said fully extended position.

11. The component mounting apparatus according to claim 7, wherein the components are accommodated in rows on the trays, the mounting apparatus further comprising a component transfer device for taking out the components and for transporting said components to a predetermined pick-up position of the mount head in the vicinity of the substrate.

12. The component mounting apparatus according to claim 7, wherein said tray parts feeder further comprises tray plates, said stacked trays being accommodated on respective ones of said tray plates, each at a predetermined location thereon.

13. A component mounting apparatus, comprising:

a substrate transfer section operable to transfer a substrate and to position the substrate at a predetermined component mounting position;

a tray parts feeder accommodating stacked trays on which components are arranged, the components being accommodated in rows on the trays, at least one of said substrate transfer section and said tray parts feeder being movable vertically to permit vertical positioning of said substrate transfer section and said tray parts feeder relative to one another such that a selected one of said trays may be oriented in a tray discharge position in which said selected one of said trays is positioned lower than said substrate transfer section, said selected one of said trays being movable laterally outward of the tray parts feeder in a direction of said substrate transfer section between a stacked position and a fully extended position, at least a portion of said selected one of said trays in said tray discharge position passing directly below said substrate transfer section when moved to said fully extended position;

a mount head movable in X and Y directions for picking up selected ones of said components supplied from the selected one of said trays of the tray parts feeder when located between said stacked position and said fully extended position and for mounting said components onto the substrate located at the mounting position; and a component transfer device for taking out the components and for transporting said components to a predetermined pick-up position of the mount head in the vicinity of the substrate, the component transfer device including an elevator provided with a component holder at a distal end thereof, the elevator having a stop for engaging structure of said component transfer device, said stop being locatable at a selected height for determining a position of the component holder in upward and downward directions.

14. A component mounting apparatus, comprising:

a substrate transfer section operable to transfer a substrate and to position the substrate at a predetermined component mounting position;

a tray parts feeder accommodating stacked trays on which components are arranged, the components being accommodated in rows on the trays, at least one of said substrate transfer section and said tray parts feeder being movable vertically to permit vertical positioning of said substrate transfer section and said tray parts feeder relative to one another such that a selected one of said trays may be oriented in a tray discharge position in which said selected one of said trays is positioned lower than said substrate transfer section, said selected one of said trays being movable laterally outward of the tray parts feeder in a direction of said substrate transfer section between a stacked position and a fully extended position, at least a portion of said selected one of said trays in said tray discharge position passing directly below said substrate transfer section when moved to said fully extended position;

a mount head movable in X and Y directions for picking up selected ones of said components supplied from the selected one of said trays of the tray parts feeder when located between said stacked position and said fully extended position and for mounting said components onto the substrate located at the mounting position; and a component transfer device for taking out the components and for transporting said components to a predetermined pick-up position of the mount head in the vicinity of the substrate, the component transfer device comprising a shuttle for transporting the components to the pick-up position of the mount head and a transfer unit for taking out the components from the tray and transferring them onto the shuttle.

15. The component mounting apparatus according to claim 14, wherein the shuttle is suitably configured to accommodate and transport at least two components at one time.

* * * * *